United States Patent [19]
White

[11] Patent Number: 6,106,612
[45] Date of Patent: Aug. 22, 2000

[54] LEVEL DETECTOR AND METHOD FOR DETECTING A SURFACE LEVEL OF A MATERIAL IN A CONTAINER

[75] Inventor: Barton V. White, Oregon City, Oreg.

[73] Assignee: SEH America Inc., Vancouver, Canada

[21] Appl. No.: 09/090,396

[22] Filed: Jun. 4, 1998

[51] Int. Cl.[7] ................................................ C30B 15/20
[52] U.S. Cl. ........................ 117/14; 117/201; 117/202
[58] Field of Search .................................. 117/200, 201, 117/202, 900

[56] References Cited

U.S. PATENT DOCUMENTS

| | | |
|---|---|---|
| 3,882,319 | 5/1975 | Clement et al. . |
| 3,958,129 | 5/1976 | Clement et al. . |
| 3,998,598 | 12/1976 | Bonora . |
| 4,350,557 | 9/1982 | Scholl et al. . |
| 4,710,258 | 12/1987 | Latka ....................................... 117/201 |
| 4,915,775 | 4/1990 | Katsuoka et al. . |
| 4,926,357 | 5/1990 | Katsuoka et al. ......................... 117/201 |
| 5,138,179 | 8/1992 | Baba et al. . |
| 5,170,061 | 12/1992 | Baba ....................................... 117/201 |
| 5,240,684 | 8/1993 | Baba et al. .............................. 117/201 |
| 5,653,799 | 8/1997 | Fuerhoff . |
| 5,656,078 | 8/1997 | Fuerhoff . |
| 5,665,159 | 9/1997 | Fuerhoff . |
| 5,746,825 | 5/1998 | Von Ammon et al. .................... 117/14 |

FOREIGN PATENT DOCUMENTS 0 498 653 B1  8/1992  European Pat. Off. .

*Primary Examiner*—Felisa Garrett
*Attorney, Agent, or Firm*—Oliff & Berridge, PLC

[57] ABSTRACT

A level detector detects the level of an approximately flat surface of a substance in a container. The level detector illuminates a portion of the surface, and detects the location of the illuminated portion on the surface. Based on detecting the location of the illuminated portion, the level detector generates a signal related to the level of the surface, which can represent the level of the surface in a direction perpendicular to the surface. A method for determining a level of a surface of a substance in a container includes illuminating a portion of the surface, detecting a location of the illuminated portion on the surface, and generating a signal related to the level of the surface based on the result of detecting the location of the illuminated portion.

37 Claims, 4 Drawing Sheets

LEVEL DETECTOR AND METHOD FOR DETECTING A SURFACE LEVEL OF A MATERIAL IN A CONTAINER

BACKGROUND OF THE INVENTION

1. Field of Invention

This invention generally relates to a method and apparatus for detecting a surface level of a material in a container. Specifically, the invention relates to illuminating a portion of a surface and detecting a position of the illuminated surface portion to determine and/or control the surface level.

2. Description of Related Art

The Czochralski method is widely used in the semiconductor industry and involves melting a semiconductor material such as silicon in a crucible, dipping a seed crystal into the melt, and withdrawing the seed crystal from the melt. As the seed crystal is slowly withdrawn from the melt, material in the melt crystallizes and forms a larger monocrystalline ingot. The diameter and length of the monocrystalline ingot that is formed is controlled based on various factors, including the pull rate of the crystal from the melt, and the melt surface level.

Various methods and apparatus exist for controlling the melt level in a Czochralski-type crystal growing device, as discussed in U.S. Pat. No. 3,882,319 to Clement et al., U.S. Pat. No. 4,350,557 to Scholl et al., and U.S. Pat. No. 4,915,775 to Katsuoka et al.

However, the methods and apparatus disclosed in these patents involve complex devices, or require an accurate estimate of the amount of semiconductor material that is withdrawn from the melt crucible to form the crystal ingot.

SUMMARY OF THE INVENTION

Accordingly, this invention provides a surface level detection device that is simple in construction, accurate, and requires no estimation of material that is removed from a container.

In one aspect, the invention provides a method for generating a signal related to a level of a surface of a material in a container. A portion of the surface is illuminated and a location of the illuminated portion is detected. Based on the result of detecting the location of the illuminated portion, a signal related to the level of the surface is generated.

In one aspect of the invention, a signal generated based on a result of detecting a location of the illuminated portion on the surface represents at least a level of the surface in a direction approximately perpendicular to the surface.

In one aspect of the invention, a signal generated based on a result of detecting a location of the illuminated portion on the surface is used to control the level of the surface in a direction approximately perpendicular to the surface.

The invention also provides a surface level detection device comprising an illumination source that illuminates a portion of the surface, a detector that detects the illuminated portion and generates a detection signal representing a location of the illuminated portion on the surface, and a processor that generates a signal related to a level of the surface based on the detection signal.

In one aspect of the invention, a processor generates a signal based on a determined location of the illuminated surface portion.

In one aspect of the invention, a signal generated by a processor represents a level and/or change in level of the surface.

In one aspect of the invention, a signal generated by a processor is used to control the level of the surface.

In one aspect of the invention, a processor controls the level of the surface based on a determined level of the surface.

In one aspect of the invention, the detector comprises a plurality of imaging elements that image adjacent, non-overlapping areas of a surface and outputs a signal indicative of the surface level.

BRIEF DESCRIPTION OF THE DRAWINGS

The invention is described in relation to the following drawings, in which reference numerals refer to like elements, and wherein.

DETAILED DESCRIPTION OF PREFERRED EMBODIMENTS

The invention described herein can be used with various types of devices. For example, the invention can be used to determine the level of a surface of any liquid, solid, powder, or any other material that forms a substantially flat surface in any type of container. For convenience of reference, the invention is described as used in a semiconductor crystal growing device using the Czochralski method, in which context the invention is particularly useful.

Figure 1:
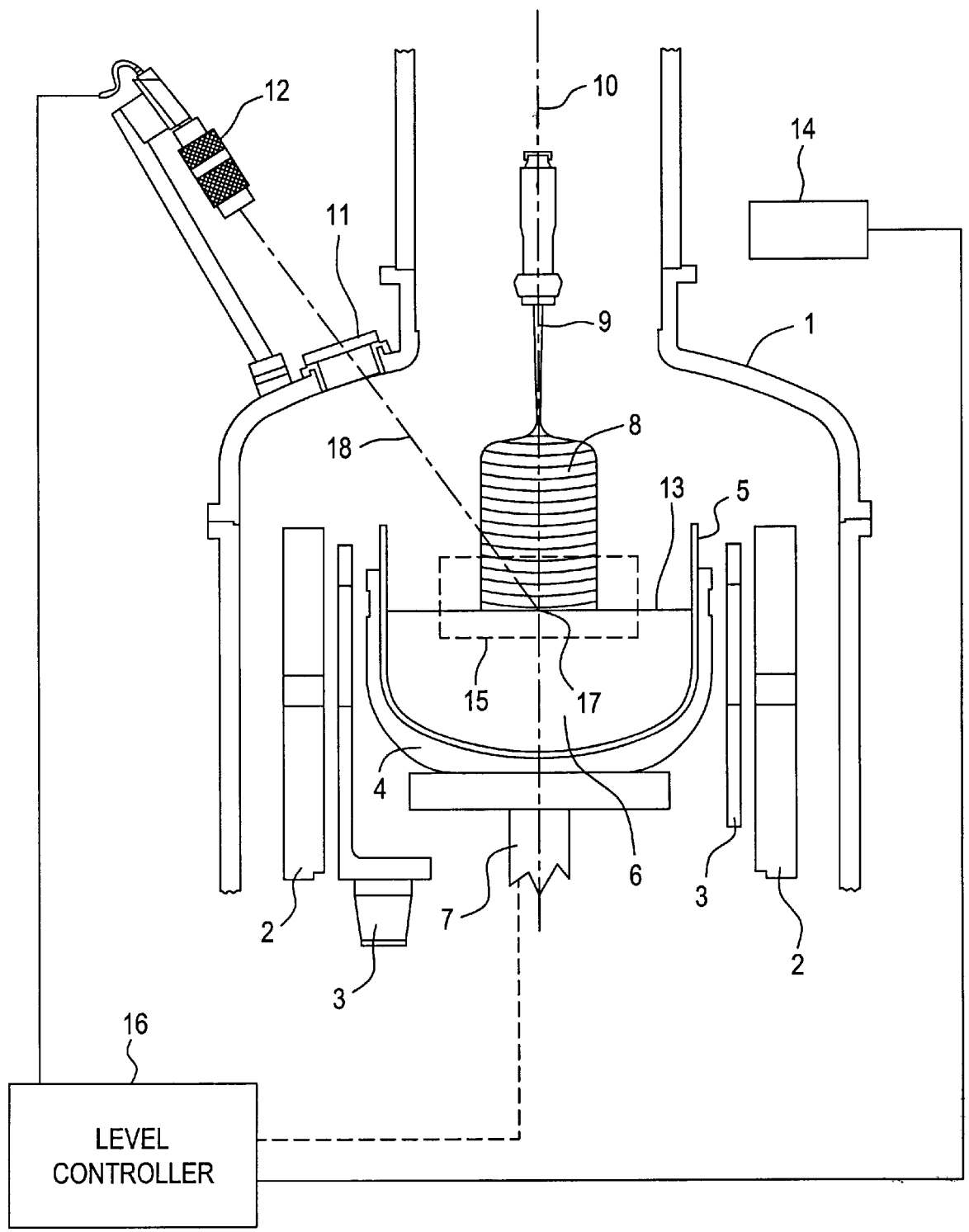
FIG. 1 is a partial functional block diagram and sectional side-view of a Czochralski-type crystal growing apparatus.

FIG. 1 shows a sectional side-view of a Czochralski-type crystal growing apparatus having a growing chamber 1. Within the growing chamber 1 are a heat insulator 2 and a heater 3 that heats a graphite susceptor 4, a quartz crucible 5 and a semiconductor melt 6. The heater 3 maintains the melt 6 at a desired temperature, preferably just above the freezing point of the melt 6 contained in the crucible 5. The graphite susceptor 4 is mounted on a rotatable shaft 7 that both rotates and moves the graphite susceptor 4 up and down. Also shown is a semiconductor crystal 8 that is being withdrawn from the melt 6. A top of the crystal 8 is formed by a seed crystal 9, which is attached to a rotatable wire 10. The rotatable wire 10 rotates and withdraws the crystal 8 from the melt 6. Details regarding the control and drive mechanisms associated with moving the rotatable shaft 7 and the rotatable wire 11 are not discussed here, since such details are well known to those of skill in the art.

Preferably, at least one viewport 11 is formed in the growing chamber 1 so that an illumination source 12 can direct a beam or beams of illumination 18 at a surface 13 of the melt 6. However, the illumination source 12 could be provided inside of the growing chamber 1, eliminating the need for a viewport 11. Preferably, the illumination source 12 is a laser, but other illumination sources can be used that produce visible or non-visible light or other electromagnetic radiation, such as x-rays, radiowaves, or microwaves, or other types of radiation, such as electrons, or other particles. Any type of illumination can be used, provided that the illumination can be detected by some type of detector, although it is preferable that the illumination not interact adversely with the material being illuminated or the system in which it is used. The illumination need not be directly emitted from the illumination source 12 to a surface. Instead, the illumination could be conducted from a remote location by a carrier, such as an optical fiber, mirror arrangement, waveguide or lens system, to a position where the illumination is emitted toward the surface.

Figure 2:
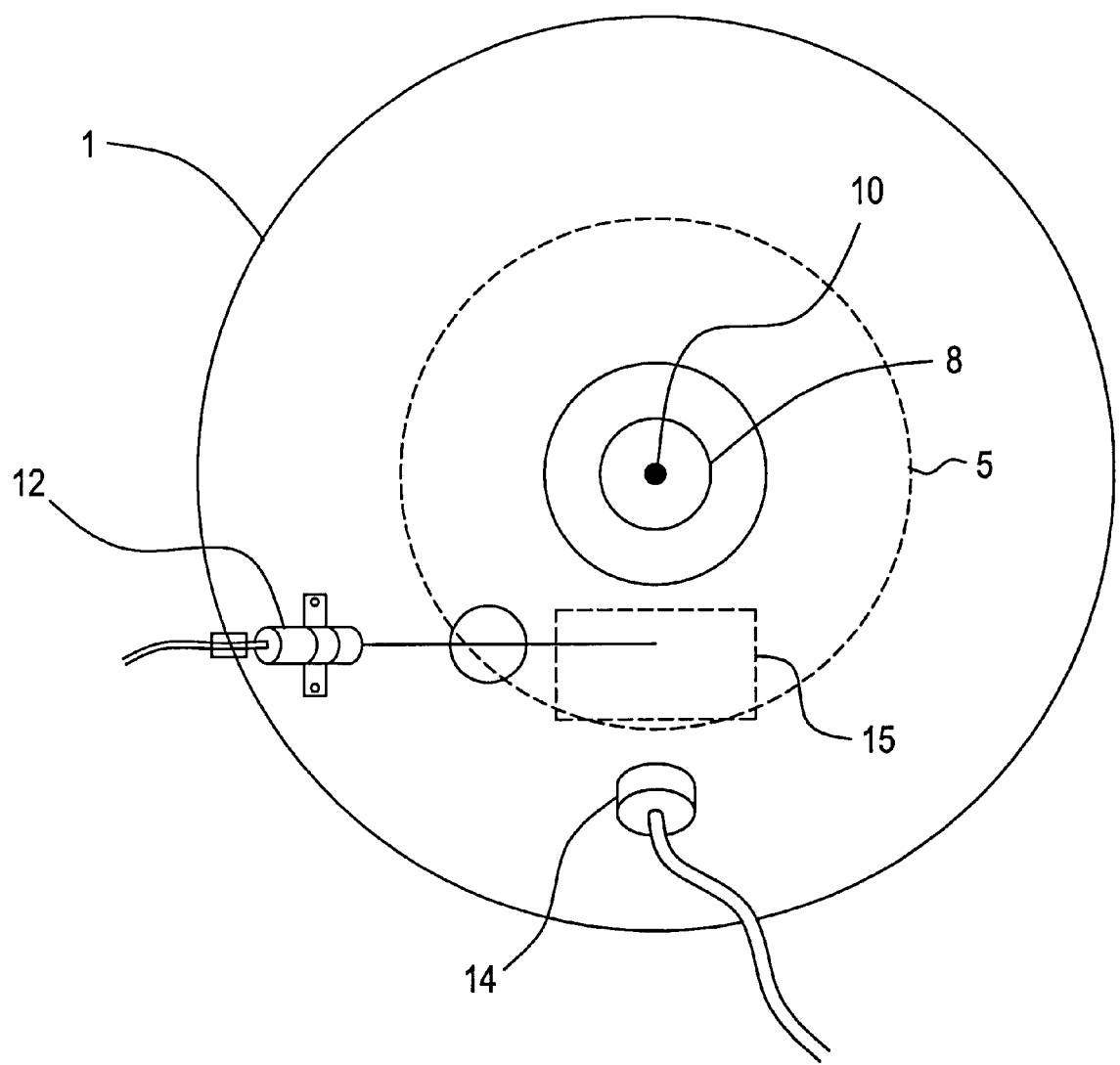
FIG. 2 is a top view of the Czochralski-type crystal growing apparatus.

Preferably, a detector 14, such as a CCD imaging device, is positioned at a top and outside of the growing chamber 1, as shown in FIG. 2. As with the illumination source 12, the detector 14 could be positioned inside of the growing chamber 1, eliminating the need for a viewport 11 provided that the environment inside the growing chamber 1 does not affect the operation of the detector 14 or illumination source 12. Although the detector 14 is preferably a CCD imaging device, the detector can be any type of device that is sensitive to the illumination emitted by the illumination source 12. For example, the detector 14 could be a silicon photodiode (SPD) or array of SPDs, an x-ray detector, electron beam detector, etc.

Preferably, the detector 14 has a view area 15 of the melt surface 13. However, the detector 14 could be positioned directly adjacent the surface. Although this may be impossible when detecting the level of a semiconductor melt because the high temperatures could damage the detector 14, positioning the detector 14 at the surface of other substances, such as water or a powder is possible.

A level controller 16 preferably includes a processor (not shown) that performs data input and output functions, signal generation and other data processing functions necessary to operate in accordance with the invention. The processor can also include a memory for storing data. Although the level controller 16 need not include any elements other than the processor, the level controller 16 can include various other devices to perform control functions, such as relays, communications devices, input and output devices, such as a keyboard and monitor, motors, transducers, mechanical linkages, etc.

Preferably, the level controller 16 controls the operation of the illumination source 12 and the detector 14. This allows the level controller 16 to control the illumination source 12 to emit illumination only when desired, and the detector 14 to detect the illumination at a desired time. However, the illumination source 12 could be simply turned on and off by an operator, timer or the like and not be controlled by the level controller 16. Likewise, the detector 14 need not be controlled by the level controller 16 and could output a detection signal at a predetermined timing or based on some other criteria, such as a detected change in illumination intensity or position, or upon activation by an operator.

Preferably, the level controller 16 inputs image data from the detector 14 through a hard wire connection. However, the level controller 16 could input image data or another signal, such as one representing a detected change in illumination intensity or position, in a wireless manner or over a network or other communications device.

Preferably, the level controller 16 processes the image data received from the detector 14 to thereby determine the location of an illumination spot 17 on the melt surface 13, i.e. the portion of the melt surface 13 that is illuminated by the beam 18. However, as discussed above, the level controller 16 could input a signal from the detector 14 that represents a detected change in the illumination spot 17 location relative to a previous or desired position, either in amount, direction or both, or that represents the actual location of the illumination spot 17 on the surface 13.

Based on the detected location of the illumination spot 17, or some other signal received from the detector 14, the level controller 16 preferably determines the level of the melt surface 13. However, the level controller 17 could generate a control signal to adjust the melt level based on signals received from the detector 14 without determining the actual melt level. Preferably, the level controller 16 controls the rotatable shaft 7 to adjust the melt level in accordance with the determined level of the melt surface 13. However, the level controller 16 could simply store the determined level for later use, or output the result to an operator who adjusts the level manually. The surface level could be adjusted by adding material to or removing material from a container, by adjusting the position of the surface relative to other apparatus, or by adjusting the position of the apparatus relative to the surface.

Figure 3A:
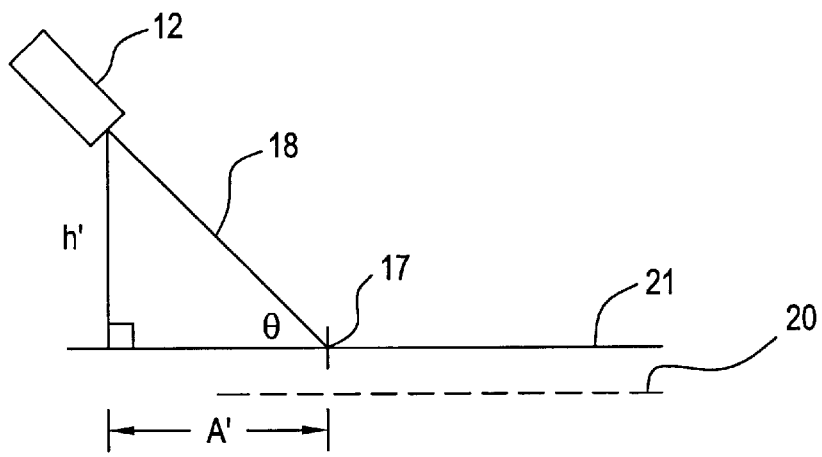
FIGS. 3*a*–3*c* show examples for determining three different melt levels.
Figure 3B:
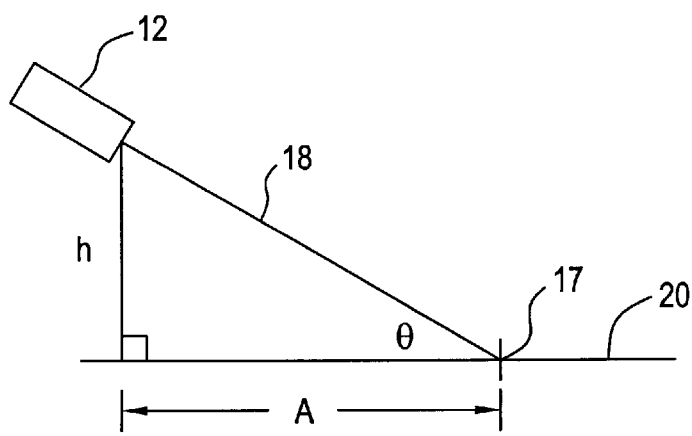
Figure 3C:
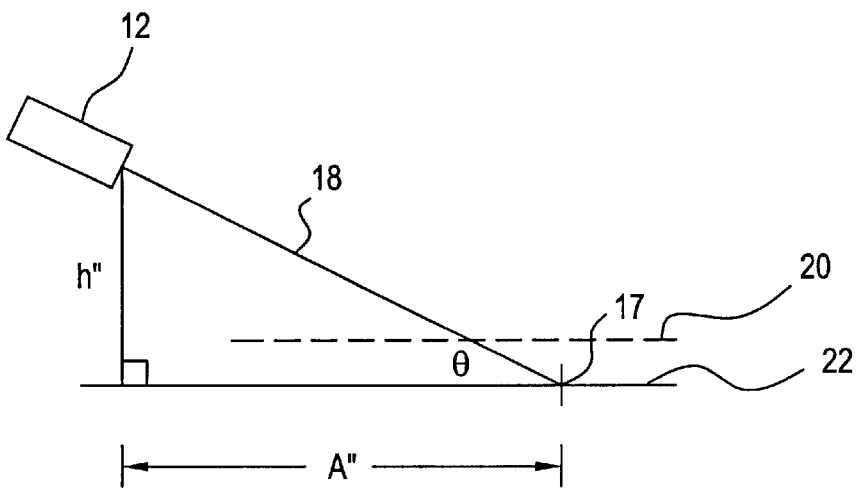

FIGS. 3a–3c show a principle behind one way that the level controller 16 can determine the relative height of the melt surface 13. FIG. 3b shows the condition where the melt surface 13 is at a desired height h from the illumination source 12. Of course, the desired height could be measured from any reference point, either fixed or moving. However, the height h to the illumination source 12 is used here for simplicity of explanation.

When the melt surface 13 is at a desired level 20 shown in FIG. 3b, the level controller 16 determines that the illumination spot 17 is located at a horizontal distance A from the illumination source 12. In this example, the beam 18 forms an angle θ with the melt surface 13. Thus, the height h from the melt surface 13 to the illumination source 12 is defined as shown in Equation 1:

$$h = A \sin\theta$$

Thus, as shown in FIG. 3a, when the level controller 16 detects that the illumination spot 17 is located at a horizontal distance A' from the illumination source 12, the level controller 16 determines that the melt surface 13 is at a position 21 that is a vertical distance h' from the illumination source 12. Accordingly, the level controller 16 controls the rotatable shaft 7 to move the melt level surface 13 downward a distance of h–h', stores or outputs the determined level, or takes other action as desired.

In contrast, as shown in FIG. 3c, when the melt surface 13 is at a level 22 that is lower than the desired level 20, the level controller 16 determines that the illumination spot 17 is located at a horizontal distance A" from the illumination source 12, and thus determines that the melt surface 13" is located at a vertical distance h" from the illumination source 12. Accordingly, the level controller 16 controls the rotatable shaft 7 to move the graphite susceptor 4 upward a distance of h"–h, stores or outputs the determined level, or takes other action as desired.

Preferably, the illumination source 12 is fixed in place, and provides a beam 18 that forms an angle θ with the melt surface 13 that is not equal to 90°. If the illumination source 12 is movable, the level controller 16 or detector 14 is preferably provided with accurate information regarding the position of the illumination source 12 relative to a desired melt level and the angle θ that the beam 18 forms with the melt surface 13, unless the illumination source 12 moves in a direction parallel to the beam 18 without changing the beam's position or angle relative to the surface 13. With this information, adjustments could be made to the detection signal generated by the detector 14 or to the determined level, control signals or other signals generated by the level controller 16.

As will be understood, for smaller angles of θ, the illumination spot 17 will move a relatively larger distance for changes in the melt surface 13 level as compared to larger angles of θ. Thus, for certain situations, such as when the surface 13 is a large distance away from a desired location, it may be preferable to have the illumination source 12 initially positioned to emit a beam 18 that forms a relatively large angle θ with the surface 13 to provide a coarse level of control or detection. When the surface 13 approaches the desired level, the illumination source 12 could be moved to a position to emit a beam 18 that forms a relatively small angle θ with the surface 13 to provide a finer level of control or detection. Rather than move the illumination source 12, two or more illumination sources 12 could be used to achieve desired levels of control or detection.

Preferably, the detector 14 is fixed in position. However, the detector 14 could be movable, or have a zooming capability, to provide signals based on varying view area 15 size or position. As with the illumination source 12, if the detector 14 is movable, the level controller 16 is preferably provided with accurate information regarding the current location of the detector 14, or the detector 14 outputs a signal indicative of the change in position. For example, the detector 14, the illumination source 12 and/or some other device could be provided with motion sensing devices that detect the change in position or movement of the detector 14, illumination source 12 and/or other parts of the system. This information could be used to adjust the direction of the beam 18 emitted by the illumination source 12, adjust the signal output by the detector 14, or adjust the determined level of the surface 13. By providing such a feature, the system could compensate for vibrations or other predicted or unpredictable movement of the different components in the system.

As discussed above, the detector 14 is preferably a CCD imaging device. In the described embodiment, the detector 14 outputs an image signal to the level controller 16 representing light detected within the view area 15. The level controller 16 inputs the image signal and, using known image analysis techniques, determines the location of the illumination spot 17 within the view area 15. Based on the determined location, the level controller 16 can determine the level of the melt surface 13. Preferably, the illumination source 12 produces the illumination spot 17 on the melt surface 13. However, the illumination source 12 could produce another pattern on the melt surface 13 so that the level controller 16 can more easily identify the illuminated portion of the surface 13. For example, the illumination source 12 could produce a series of bars of light on the surface 13. This, or another, pattern could allow the level controller 16 to more easily segment the "bars of light" pattern from other image features in the image signal.

Preferably, the system is initially calibrated so that the illumination spot 17 is located at a center of the view area 15 when the melt surface 13 is at a desired level. Therefore, the level controller 16 could control the rotatable shaft 7 whenever the illumination spot 17 moves from the center of the view area 15. This relatively simple type of feedback control would not require the level controller 16 to determine the exact location of the illumination spot 17 or the level of the melt surface 13. Instead, the level controller 16 could control the level of the melt surface 13, or take other appropriate action, such as outputting a signal "Level Low", whenever the illumination spot 17 moves from the center of the view area 15.

Rather than determine the location of the illumination spot 17 in the view area 15 and calculate a level of the melt surface 13, the level controller 16 could be provided with, or generate, a look-up table of different view area 15 images that each correspond to different melt surface 13 levels or other information. Using the look-up table, the level controller 16 could compare the image signal input from the detector 14 to the stored images. When a match is found, the level controller 16 could retrieve the melt surface 13 level or other information associated with the matched image.

Figure 4:
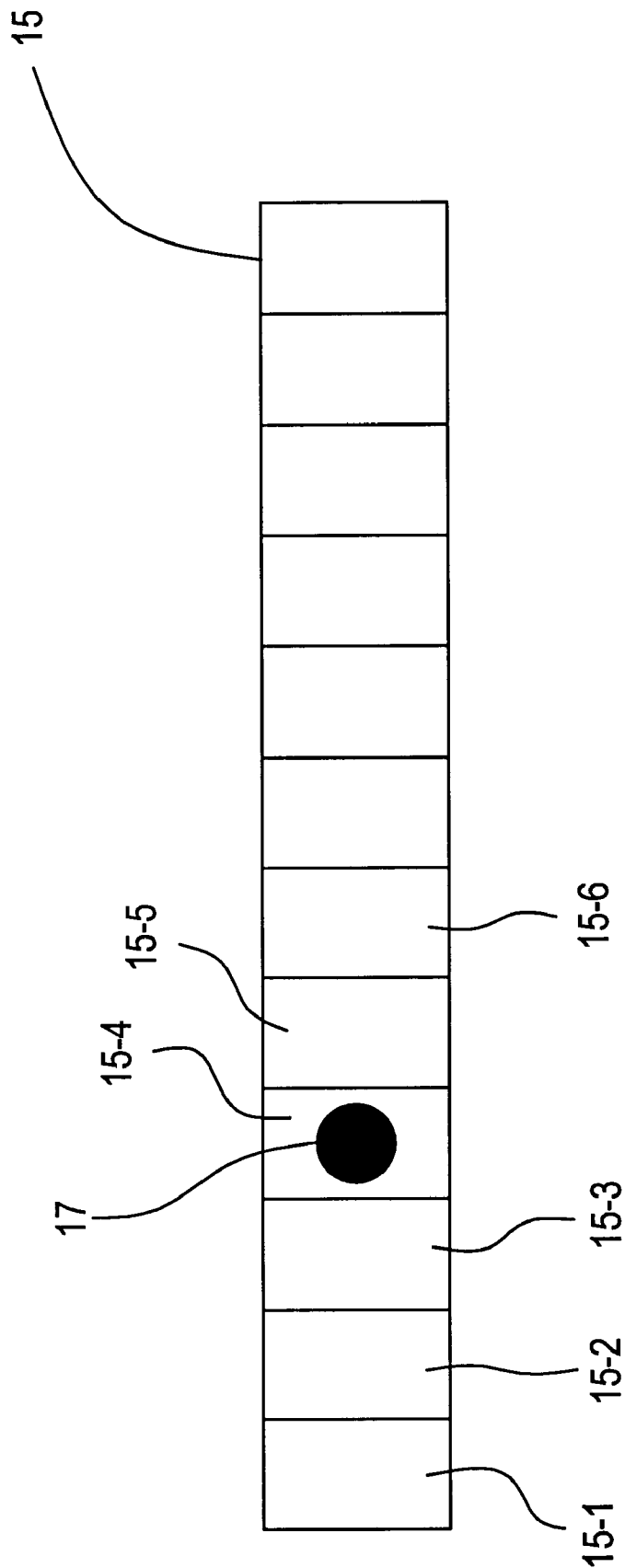
FIG. 4 shows an example view area for an array of imaging elements in a detector.

Other possibilities for detecting the illumination spot 17 and melt surface 13 level will be appreciated by those of skill in the art. For example, the detector 14 could comprise an array of silicon photodiodes (SPDs) or other imaging elements, that each image adjacent, preferably non-overlapping areas 15-1, 15-2, . . . of the melt surface 13, as shown in FIG. 4. Accordingly, the level controller 16 would not have to process the image data received from the detector 14 to determine the relative location of the illumination spot in the detector's 14 view area 15. Instead, the level controller 16 and detector 14 could be calibrated so that a known melt surface 13 level or other information, such as a command to move the surface 13 downward or to output a message, "Level High" or the like, corresponds to each image area 15-1, 15-2, . . . . Accordingly, the level controller 16 could determine the level of the melt surface 13 or perform other desired actions based on which of the imaging elements outputs a signal representing detection of the illumination spot 17 in a specific image area 15-1, 15-2, . . . .

The level controller 16 preferably comprises a general purpose computer or other data processing device capable of performing the control and image analysis functions described above. As would be understood by one of ordinary skill in the art, for example, the level controller 16 could be implemented as a single special purpose integrated circuit (e.g., ASIC) or an array of ASICs, each having a main or central processor section for overall, system-level control, and separate sections dedicated to performing various different specific computations, functions or other processes under the control of the central processor section. The level controller 16 can also be implemented using a plurality of separate dedicated or programmable integrated or other electronic circuits or devices, e.g., hardwired electronic or logic circuits such as discrete element circuits or programmable logic devices, including PLDs, PLAs, PALs or the like.

While the invention has been described with reference to specific embodiments, the description of the specific embodiments is illustrative only and is not to be construed as limiting the scope of the invention. Various other modifications and changes may occur to those skilled in the art without departing from the spirit and scope of the invention as set forth herein.

What is claimed is:

1. A level detector for a crystal growing device, comprising:
    an illumination source that illuminates a portion of a surface of a material in a container;
    a detector that detects the illuminated portion and outputs a detection signal representing a location of the illuminated portion on the surface; and
    a processor that receives the detection signal, compares the detection signal to an earlier received detection signal and generates a signal related to the level of the surface based on the comparison.

2. The level detector of claim 1, wherein the illumination source is a laser.

3. The level detector of claim 1, wherein an angle of incidence between an illumination beam emitted by the illumination source and the surface is between 0 and 90°.

4. The level detector of claim 1, wherein the illumination source illuminates the surface portion based on a control signal from the processor.

5. The level detector of claim 1, wherein the detector is a CCD imaging device.

6. The level detector of claim 1, wherein the detector comprises an array of imaging elements.

7. The level detector of claim 1, wherein the signal generated by the processor is used to control a level of the surface.

8. The level detector of claim 1, wherein the signal generated by the processor represents the level of the surface.

9. The level detector of claim 1, wherein the signal generated by the processor represents a direction and distance of change of the level of the surface.

10. The level detector of claim 1, wherein the processor determines a location of the illuminated portion on the surface based on the detection signal, and generates the signal based on the determined location of the illuminated portion on the surface.

11. The level detector of claim 1, wherein the detection signal represents an image of the surface including the illuminated portion and the processor analyzes the image to generate the signal.

12. A method for generating a signal related to a level of a substance in a container having a growing crystal positioned at a surface of the substance, comprising the steps of:

illuminating a portion of the surface of the substance while the growing crystal is being withdrawn from the surface;

detecting a location of the illuminated portion of the surface; and generating a signal related to the level of the surface based on a result of detecting the location of the illuminated portion for two withdrawal positions of the crystal.

13. The method of claim 12, further comprising the step:

controlling the level of the surface based on the signal.

14. The method of claim 12, wherein the detecting step comprises:

imaging an area of the surface that includes the illuminated portion; and generating a signal representing an image of the area.

15. The method of claim 12, further comprising determining the location of the illuminated portion by:

receiving an image signal representing an area of the surface that includes the illuminated portion; and analyzing the image signal to determine the location of the illuminated portion in the area.

16. The method of claim 12, wherein the generating a signal step comprises:

comparing the location of the illuminated portion to a set of stored locations and corresponding surface levels; and determining a level of the surface based on a result of comparing the location of the illuminated portion to the set of stored locations.

17. A level detector for detecting a level of a substance in a container having a growing crystal positioned at a surface of the substance, comprising:

illumination means for illuminating a portion of the surface of the substance while the growing crystal is being withdrawn from the surface;

detecting means for detecting a location of the illuminated portion of the surface; and generating means for generating a signal related to the level of the surface based on a result of detecting the location of the illuminated portion of the surface for two withdrawal positions of the crystal.

18. The level detector of claim 17, further comprising:

position control means for controlling the level of the surface based on the signal.

19. The level detector of claim 17, wherein the illumination means comprises a laser, and the detecting means comprises a CCD imaging device.

20. The level detector of claim 17, wherein the detecting means outputs a detection signal that represents an image of an area of the surface including the illuminated portion, and the generating means analyzes the detection signal to determine the location of the illuminated portion.

21. A semiconductor crystal growing device, comprising:

a crystal growing chamber;

a crucible inside of the crystal growing chamber for containing a semiconductor melt;

an illumination source that emits a beam of illumination to illuminate a portion of a surface of the semiconductor melt while a crystal is positioned at the surface of the semiconductor melt;

a detector that images a view area of the surface of the semiconductor melt and outputs a detection signal representing a location of the illuminated portion of the surface; and a processor that receives the detection signal and generates a signal related to the level of the surface of the semiconductor melt based on the detection signal.

22. The semiconductor crystal growing device of claim 21, wherein the illumination source is a laser.

23. The semiconductor crystal growing device of claim 21, wherein the crystal growing chamber has at least one viewport, the detector and the illumination source are positioned outside of the crystal growing chamber, and the illumination source emits the beam of illumination through the viewport.

24. The semiconductor crystal growing device of claim 21, wherein the detector is a CCD imaging device.

25. The semiconductor crystal growing device of claim 21, wherein the detector comprises an array of imaging elements.

26. The semiconductor crystal growing device of claim 21, further comprising a crucible elevator responsive to the signal generated by the processor.

27. The semiconductor crystal growing device of claim 21, wherein the signal generated by the processor represents the level of the surface.

28. The semiconductor crystal growing device of claim 21, wherein the signal generated by the processor represents a direction and distance of change of the level of the surface.

29. The semiconductor crystal growing device of claim 21, wherein the processor determines a location of the illuminated portion on the surface based on the detection signal, and generates the signal based on the determined location of the illuminated portion on the surface.

30. The semiconductor crystal growing device of claim 21, wherein the detection signal represents an image of the surface including the illuminated portion and the processor analyzes the image to generate the signal.

31. A method for growing a semiconductor crystal, comprising the steps of:

dipping a seed crystal into a semiconductor melt;

pulling the seed crystal from the melt at a controlled rate, thereby allowing some of the semiconductor melt to crystallize and form a crystal of desired dimensions from the seed crystal;

illuminating a portion of a surface of the semiconductor melt while the crystal is positioned at the surface;

detecting a location of the illuminated portion of the surface; and generating a signal related to the level of the surface based on a result of detecting the location of the illuminated portion.

32. The method of claim 31, further comprising controlling the level of the semiconductor melt surface based on the signal.

33. The method of claim 31, wherein the signal represents the level of the surface of the semiconductor melt.

34. The method of claim 31 wherein the signal represents a direction and distance of change of the level of the surface of the semiconductor melt.

35. The method of claim 31, wherein the detecting step comprises:

imaging an area of the surface that includes the illuminated portion; and generating a signal representing an image of the area.

36. The method of claim 31, further comprising determining the location of the illuminated portion by:

receiving an image signal representing an area of the surface that includes the illuminated portion; and analyzing the image signal to determine the location of the illuminated portion in the area.

37. The method of claim 31, wherein the generating a signal step comprises:

comparing the location of the illuminated portion to a set of stored locations and corresponding surface levels; and determining a level of the surface based on a result of comparing the location of the illuminated portion to the set of stored locations.

* * * * *

UNITED STATES PATENT AND TRADEMARK OFFICE
CERTIFICATE OF CORRECTION

PATENT NO. : 6,106,612
DATED : August 22, 2000
INVENTOR(S) : Barton V. WHITE

It is certified that error appears in the above-identified patent and that said Letters Patent is hereby corrected as shown below:

On the cover page, in the Assignee line, change "Canada" to --Washington--.

Signed and Sealed this

Twenty-fourth Day of April, 2001

*Attest:*

NICHOLAS P. GODICI

*Attesting Officer*   *Acting Director of the United States Patent and Trademark Office*